United States Patent [19]

Baba et al.

[11] Patent Number: 5,733,810
[45] Date of Patent: Mar. 31, 1998

[54] METHOD OF MANUFACTURING MOS TYPE SEMICONDUCTOR DEVICE OF VERTICAL STRUCTURE

[75] Inventors: Yoshiro Baba; Hiroshi Naruse, both of Yokohama, Japan

[73] Assignee: Kabushiki Kaisha Toshiba, Kawasaki, Japan

[21] Appl. No.: 820,530

[22] Filed: Mar. 19, 1997

[30] Foreign Application Priority Data

Mar. 22, 1996 [JP] Japan ................. 8-066495

[51] Int. Cl.⁶ ............................... H01L 21/70
[52] U.S. Cl. ............... 438/268; 438/270; 438/272
[58] Field of Search ........................ 438/268, 270, 438/272, 206, 212

[56] References Cited

U.S. PATENT DOCUMENTS 5,108,938  4/1992  Solomon .......................... 438/270
5,349,224  9/1994  Gilbert et al. .................... 438/270
5,532,179  7/1996  Chang et al. ..................... 438/270

*Primary Examiner*—Kevin Picardat
*Attorney, Agent, or Firm*—Finnegan, Henderson, Farabow, Garrett & Dunner, L.L.P.

[57] ABSTRACT

A groove is formed on a semiconductor substrate. A mask material layer is so formed on the surface of the semiconductor substrate as to open a groove region. With the mask material layer used as a mask, a semiconductor layer is selectively formed on the semiconductor substrate exposed with the inner wall surface of the groove. Then, the mask material layer is removed. An insulating film is formed on the semiconductor layer formed on the inner wall surface of the groove and the surface of the semiconductor substrate. The groove is buried with a conductor.

14 Claims, 4 Drawing Sheets

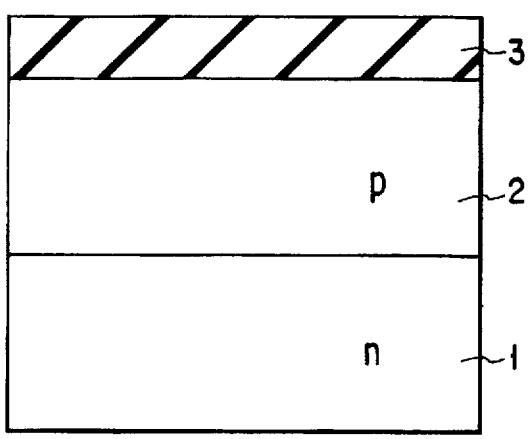
F I G. 1A
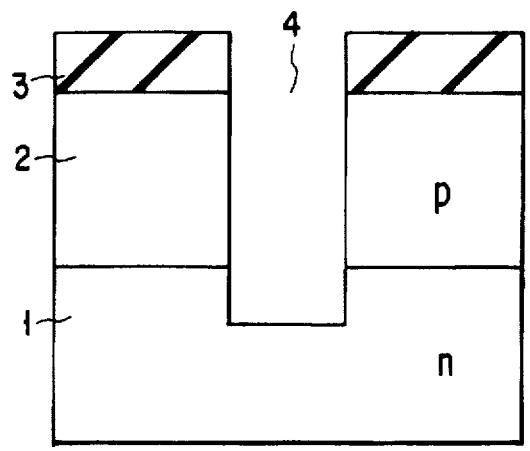
F I G. 1B
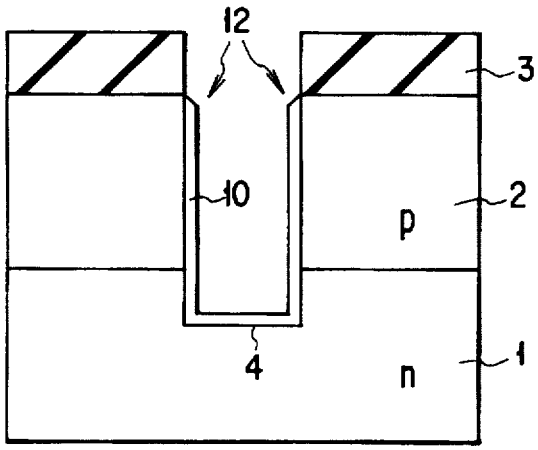
F I G. 1C
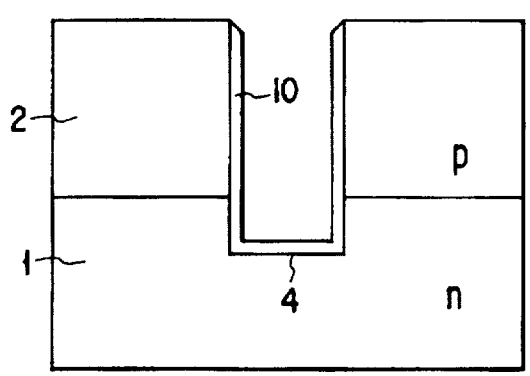
F I G. 1D
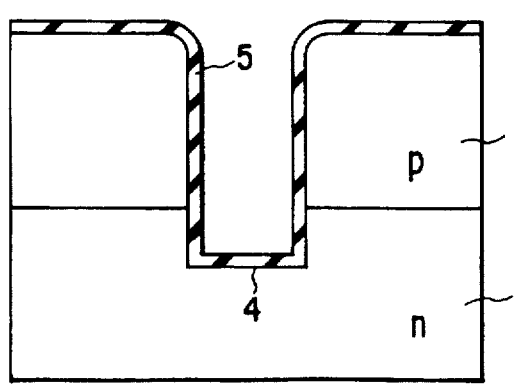
F I G. 1E
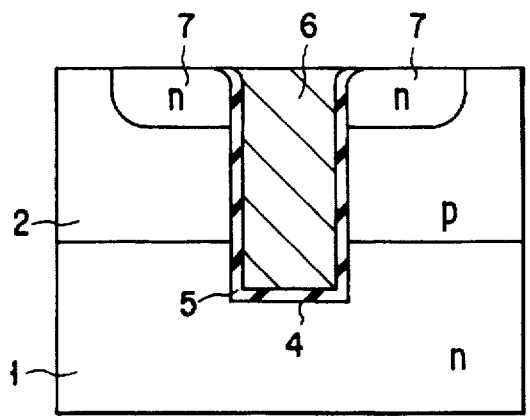
F I G. 1F

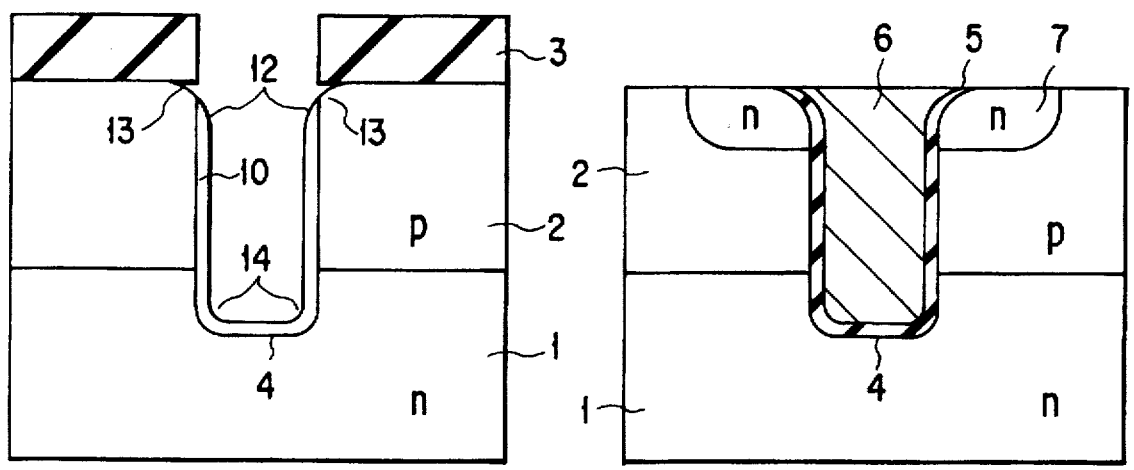
F I G. 2A   F I G. 2B
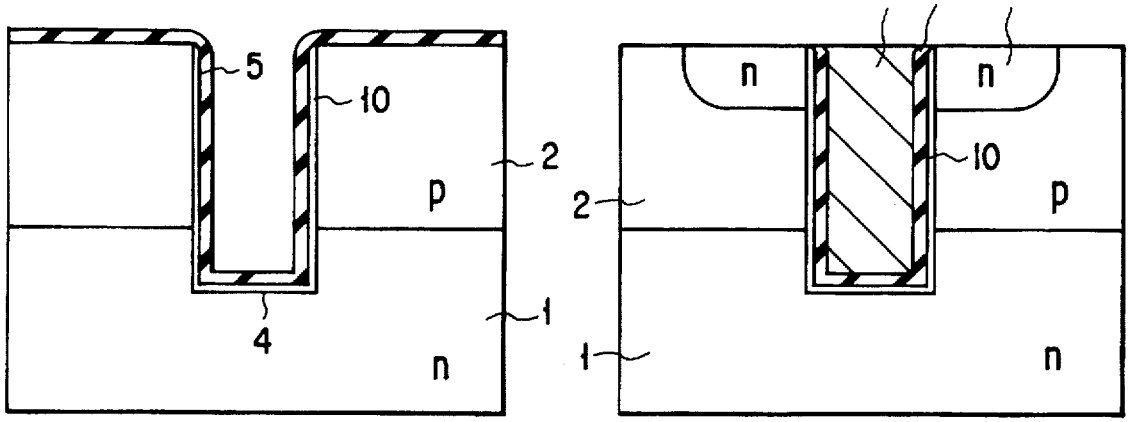
F I G. 3A   F I G. 3B
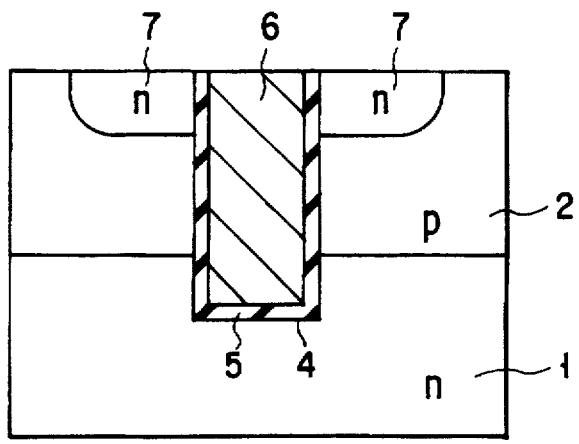
F I G. 4

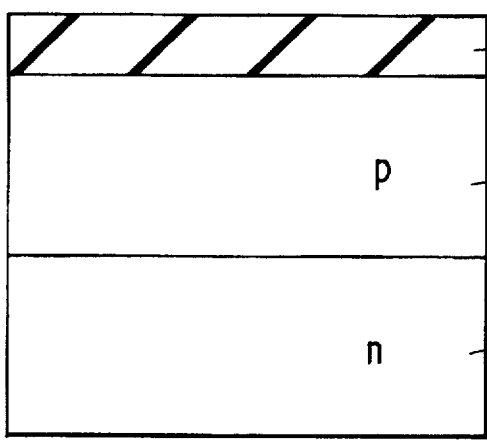
F I G. 5A
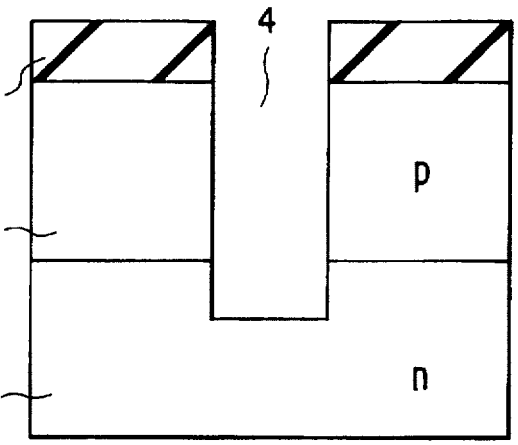
F I G. 5B
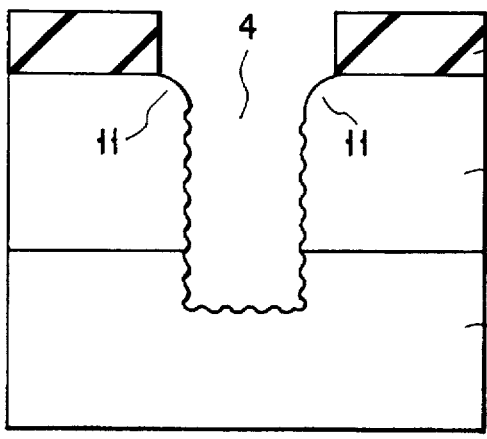
F I G. 5C
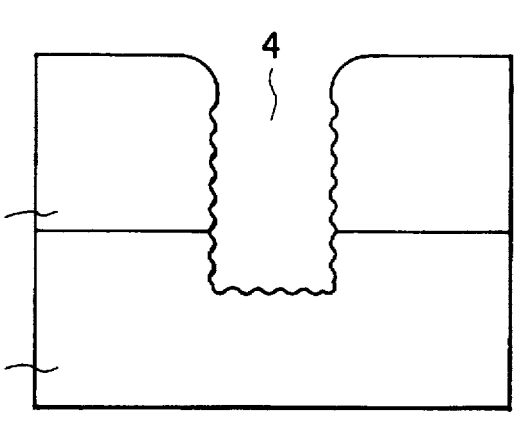
F I G. 5D
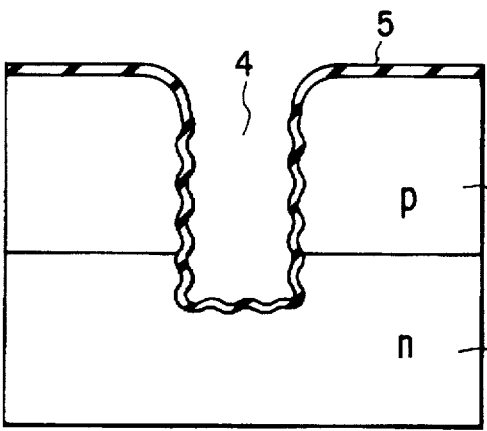
F I G. 5E
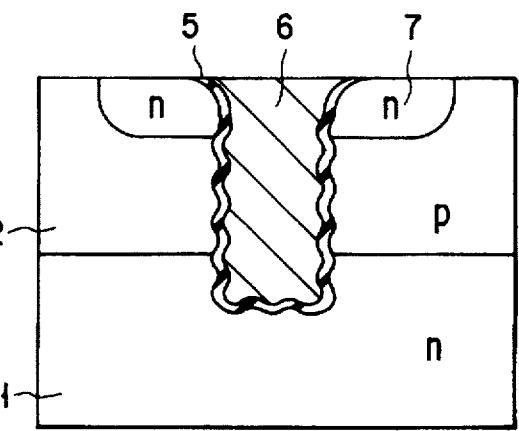
F I G. 5F 5,733,810

METHOD OF MANUFACTURING MOS TYPE SEMICONDUCTOR DEVICE OF VERTICAL STRUCTURE

BACKGROUND OF THE INVENTION

This invention relates to a method of manufacturing a MOS type semiconductor device of a vertical structure having a MOS type capacitor on an inner wall surface of a groove formed on a semiconductor substrate.

In a power insulated gate type field effect transistor (hereinafter referred to as a "power MOSFET"), a trial of reducing an on resistance by shortening its channel length has been heretofore conducted. Recently, the development of a MOSFET of a vertical structure has been advanced to further reduce the area of a cell.

FIG. 4 shows a section of a MOSFET of a vertical structure. A p type layer 2 is, for example, formed on a surface of an n type semiconductor substrate 1. A groove 4 is formed on the n type semiconductor substrate 1, and a gate electrode 6 is formed on the inner wall surface of the groove 4 through a gate insulating film 5. An n type diffusion layer 7 is formed adjacent to the groove 4 on the surface of the p type layer 2. The potential of the p type layer 2 between the n type semiconductor substrate 1 and the n type diffusion layer 7 is controlled by the gate electrode 6. Such a MOSFET structure is vertically formed on the side face of the groove 4. The channel of the MOSFET is formed near a boundary between the gate insulating film 5 formed on the side face of the groove 4 and the p type layer 2.

A conventional method of manufacturing a vertical MOSFET will be described with reference to FIG. 5A to FIG. 5F. FIG. 5A to FIG. 5F are sectional views showing the conventional method of manufacturing the Vertical MOSFET.

A p type layer 2 is formed on the surface of an n type semiconductor substrate 1. A mask material 3 of, for example, an oxide film is formed on the p type layer of the n type semiconductor substrate 1. FIG. 5A shows a section of a semiconductor device at this stage. The mask material 3 is used as an etching mask at the time of forming a groove on the semiconductor substrate 1.

Next, the mask material 3 is etched by using ordinary lithography technology and etching technology. Further, with the mask material 3 used as a mask, the semiconductor substrate 1 is etched to form a groove 4. FIG. 5B shows a section of the semiconductor device at this stage. At this time, the groove 4 is necessarily arrived at the n type semiconductor substrate 1 through the p type layer 2 as shown in FIG. 5B.

Thereafter, the mask material 3 is slightly etched by, for example, hydrofluoric acid, the mask material 3 is retracted from the end of the groove 4, and the exposed surface of the semiconductor substrate 1 is slightly etched by using, for example, surface active material and alkaline treating solution. FIG. 5C shows a section of the semiconductor device at this stage. A main object of this etching is to remove contaminant substance adhered to the inner wall surface of the groove 4 at the time of forming the groove 4 and to round corners 11 of the upper portion of the groove 4. For example, the conditions of etching by the above-mentioned alkaline treating solution are so set that the etching speed becomes different according to the orientation of the semiconductor substrate and particularly only the corners 11 of the groove 4 are earlier etched than the other inner wall surface of the groove 4, and the corners 11 of the groove 4 are rounded.

Then, the mask material 3 is etched and removed. FIG. 5D shows a section of the semiconductor device at this stage.

Further, a gate insulating film 5 of a thickness such as, for example, about 50 nm is formed on the inner wall surface of the groove 4 and the surface of the p type layer 2 by, for example, thermal oxidation. FIG. 5E shows a section of the semiconductor device at this stage.

Subsequently, an electrode material 6 of, for example, polycrystal silicon is buried in the groove 4, and an n type diffusion layer 7 is formed adjacent to the groove 4 on the surface of the p type layer 2 by using, for example, lithography technology and ion implantation technology. In this manner, a vertical MOSFET structure is completed. FIG. 5F shows a section of the semiconductor device at this stage.

As described above, according to the conventional method of manufacturing the vertical MOSFET, the corners of the groove 4 are rounded by using the alkaline treating solution. By so doing, the damage of the gate insulating film 5 by an electric field formed in the gate insulating film according to a potential difference applied between the gate electrode 6 and the n type diffusion layer 7 due to the concentration of the electric field at the corners 11 of the groove 4 is prevented. As a result, the withstand voltage of the gate insulating film is improved.

However, the alkaline treating solution also anisotropically etched the semiconductor substrate 1 exposed on the inner wall surface of the groove 4. Therefore, the uneven portion generated on the surface of the inner wall of the groove 4 at the time of etching the semiconductor substrate 1 to form the groove 4 is amplified by etching with the alkaline treating solution as shown in FIG. 5C. For example, if the alkaline treatment is so conducted that the radius of curvature of each of the corners 11 becomes 15 nm, the uneven portion becomes about 2 nm. This uneven portion is not removed even after the thermal oxidation for forming the gate insulating film 5 is executed. Since the uneven portion of the boundary between the gate insulating film and the semiconductor substrate when the MOSFET is formed on the surface of the semiconductor substrate 1 is about 0.2 nm, the uneven portion of the vertical MOSFET reaches its ten times as large as the uneven portion of the boundary.

Since carrier such as electron moving in the channel is scattered according to such uneven portion of the boundary between the gate insulating film and the semiconductor substrate, the mobility of the carrier is remarkably reduced. FIG. 6 shows the gate voltage dependence of the electron mobility of an n type MOSFET formed on a normal flat surface and the electron mobility of a vertical n type MOSFET. As shown in FIG. 6, the rise of the mobility of the electron is abrupt in the n type MOSFET of a planar structure but the rise of the mobility of the electron is very smooth in the vertical n type MOSFET. In general, a current is proportional to the mobility of the electron. Therefore, it is necessary in the conventional vertical MOSFET in which the rise of the mobility of the electron is smooth to largely vary a gate voltage in order to control the current. That is, since the conventional vertical MOSFET has high on resistance, its high speed operation becomes difficult.

Furthermore, in order to prevent the uneven portion generated on the inner wall surface of the groove 4 from being amplified, it is possible not to conduct the alkaline treatment. However, in this case, since the corners 11 of the groove 4 are not rounded, the withstand voltage of the gate insulating film is deteriorated as described above. FIG. 7 shows the dependency of an electric field strength for causing the gate oxide film 5 to dielectric break down with respect to the ratio of the thickness $T_{ox}$ of the oxide film to the radius R of curvature of each of the corners 11 of the groove 4 of the semiconductor substrate 1. The larger the radius R of curvature of the semiconductor substrate 1 to the thickness $T_{OX}$ of the oxide film is, namely, the more the corners of the groove 4 are rounded, the greater the withstand voltage is improved. The withstand voltage of the oxide film formed on the flat surface is generally about 8 MV/cm.

As described above, in order to improve the withstand voltage of the gate insulating film 5 in the conventional vertical MOSFET, it is necessary to round the corners 11 of the groove 4. However, there has been a problem that the uneven portion of the inner wall surface of the groove 4 is amplified by this treatment and the mobility of the carrier at the channel section of the MOSFET is reduced.

BRIEF SUMMARY OF THE INVENTION

It is an object of the present invention to provide a method of manufacturing a vertical MOSFET semiconductor device having high withstand voltage of a gate insulating film and large mobility of carrier at a channel section.

The object of the present invention is attained by the following constitution.

A method of manufacturing a semiconductor device comprising the steps of forming a groove on a semiconductor substrate by etching; selectively forming a semiconductor layer on the semiconductor substrate exposed on the inner wall surface of the groove with a mask material layer so formed on the surface of the semiconductor substrate as a mask as to open the groove; removing the mask material layer; forming an insulating film on the semiconductor layer formed on the inner wall surface of the groove and the surface of the semiconductor substrate; and burying a conductor at least in the insulating film in the groove.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1F are sectional views showing a method of manufacturing a semiconductor device according to a first embodiment of the invention;

FIGS. 2A and 2B are sectional views showing a method of manufacturing a semiconductor device according to a second embodiment of the invention;

FIGS. 3A and 3B are sectional views showing a method of manufacturing a semiconductor device according to a third embodiment of the invention;

FIG. 4 is a sectional view showing a conventional semiconductor device;

FIGS. 5A to 5F are sectional views showing a conventional method of manufacturing a semiconductor device;

DETAILED DESCRIPTION OF THE INVENTION

Figure 6:
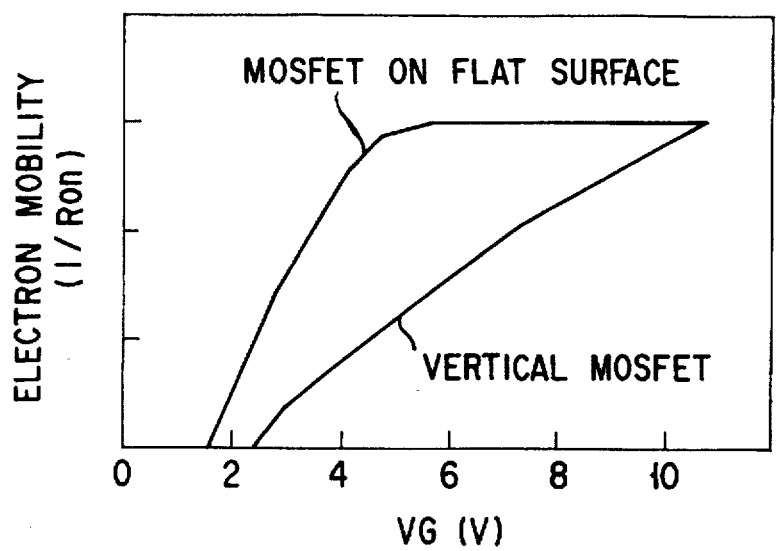
FIG. 6 is a view showing a problem of a conventional semiconductor device.

Embodiments of the present invention will be explained with reference to the accompanied drawings.

FIGS. 1A to 1F are sectional views showing a method of manufacturing a semiconductor device according to a first embodiment of the present invention.

A p type layer 2 is, for example, formed on the surface of, for example, an n type silicon substrate 1 by using, for example, epitaxial growth technology or ion implantation technology similarly to the conventional examples. A mask material 3 of, for example, an oxide film is formed on the n type semiconductor substrate 1. FIG. 1A shows a section of a semiconductor device at this stage.

Next, the mask material 3 is etched by using ordinary lithography technology and etching technology. Further, with the mask material 3 used as a mask, the semiconductor substrate 1 is so etched as to arrive at the n type semiconductor substrate 1 through the p type layer 2 to form a groove 4. FIG. 4B shows a section of the semiconductor device at this stage.

Thereafter, a natural oxide film (not shown) formed on the inner wall surface of the groove 4 and a foreign matter such as an oxide film deposited on the inner wall surface of the groove 4 in the etching step for forming the groove 4 are removed by dipping or immersing the semiconductor device in, for example, 1% concentration of hydrofluoric acid different from the conventional example. Subsequently, with the oxide film 3 used as a mask, a semiconductor layer 10 of, for example, silicon is selectively grown on the semiconductor substrate exposed with the inner wall surface of the groove 4 by epitaxial growth technology using raw material such as, for example, $SiH_2Cl_2$ and HCl. According to the epitaxial growth technology, silicon is grown on silicon, and nothing is grown on the oxide film. FIG. 1C shows a section of the semiconductor device at this stage.

Next, the mask material 3 is removed by using, for example, hydrofluoric acid. FIG. 1D shows a section of the semiconductor device at this stage.

Thereafter, a gate oxide film 5 of, for example, 50 nm is formed on the surface of the p type layer 2 and the semiconductor layer 10 by, for example, thermal oxidation. At this time, it is desirable that all the semiconductor layers 10 formed by the selective epitaxial grown are oxidized. FIG. 1E shows a section of the semiconductor device at this stage.

Then, a gate electrode material 6 such as, for example, polycrystal silicon is buried in the groove 4 similarly to the conventional example.

An n type diffusion layer 7 is so formed in the p type layer 2 as to be disposed adjacent to the groove 4 by, for example, lithography method and ion implantation technology to complete a vertical MOSFET. FIG. 1F shows a section of the semiconductor device at this stage.

In this embodiment, after the groove 4 is formed, with the mask material 3 for forming the groove 4 used as a mask, the semiconductor layer 10 such as silicon is selectively grown only on the inner wall surface of the groove 4. In this epitaxial growth, the semiconductor layer 10 is grown in a direction that the end of the semiconductor layer 10 is separated from the mask material 3, namely, toward the bottom of the groove 4. Therefore, as shown in FIG. 1C, the end 12 of the semiconductor layer 10 becomes a tapered shape to obtain the similar effect to the effective rounding of the corners of the groove 4. More specifically, the corners of the groove 4 are rounded by utilizing the tapered shape 12 of the semiconductor layer 10 formed by the selective epitaxial growth to suppress the concentration of the electric field to be applied to the gate insulating film 5 without conventional alkaline treatment, thereby improving the withstand voltage of the gate insulating film 5.

Since it is not necessary to conduct the alkaline treatment that has heretofore been conducted to round the corners of the groove 4 in the embodiment of the present invention, the uneven portion of the inner wall surface of the groove 4 by the alkaline treatment is no longer amplified.

Furthermore, the uneven portion of the surface of the semiconductor layer 10 becomes smaller than the uneven portion generated at the inner wall surface of the groove 4 by the etching for forming the groove 4. Since the uneven portion of the inner wall surface of the groove 4 is reduced, the uneven portion of the sidewall face of the groove 4 used as the channel section of the vertical MOSFET is reduced, and the surface scattering of the carrier in the channel section is suppressed. As a result, the mobility of the carrier can be increased.

In this embodiment as described above, the vertical MOSFET of high performance that the withstand voltage of the gate insulating film is high and the mobility of the carrier in the channel section is large can be realized.

Next, a second embodiment of the present invention will be explained with reference to FIG. 2A and FIG. 2B. In this second embodiment, the uneven portion of a boundary between a gate insulating film 5 and a p type layer 2 is further flattened.

Up to the steps of forming a groove on a semiconductor substrate 1 and forming a semiconductor layer 10 by using selective epitaxial growth technology, the process is similar to that of the first embodiment.

Thereafter, in this embodiment, before a mask material 3 is removed, the semiconductor device is heat treated in a hydrogen atmosphere at, for example 800° C. different from the first embodiment. FIG. 2A shows a section of the semiconductor device at this stage.

Thereafter, similarly to the first embodiment, the mask material 3 is removed, and a gate oxide film 5 is formed. Further, a gate electrode material 6 of, for example., polycrystal silicon is buried in the groove 4, an n type diffusion layer 7 is so formed as to be disposed adjacent to the groove 4 to complete a vertical MOSFET. FIG. 2B shows a section of the semiconductor device at this stage.

In this second embodiment as described above, there is a feature in that after the semiconductor layer 10 is formed by the selective epitaxial growth technology, the semiconductor device is heat treated.

In general, the uneven portion on the surface of the semiconductor layer 10 formed by the selective epitaxial growth technology is alleviated as compared with the uneven portion existing on the surface of the semiconductor substrate before the epitaxial growth is conducted, but the uneven portion is not completely removed. Therefore, in the first embodiment described above, the uneven portion remains on the surface of the epitaxially grown layer 10. However, in this second embodiment, the heat treatment is conducted after the selective epitaxial growth, and hence the surface of the semiconductor layer 10 can be flattened. As compared with the first embodiment, the surface of the channel section is further flattened, and hence the mobility of the carrier of the channel section can be more increased.

Furthermore, as shown in FIG. 2A, the corners 13 of the upper portion and the corners 14 of the bottom of the groove 4 can be smoothened by the heat treatment. Not only the faucet surface 12 of the epitaxially grown layer 10 is a tapered shape but also the corners 13 and 14 of the groove 4 are rounded, and hence the withstand voltage of the gate insulating film 5 can be further improved as compared with the first embodiment.

The heat treatment may be conducted by not limiting to the hydrogen atmosphere but in other inert gas atmosphere of, for example, nitrogen. Even in this case, the same effect can be attained.

In the first and second embodiments, all the epitaxially grown layers 10 are oxidized to form the gate oxide film 5. If all the epitaxially grown layers 10 are not oxidized, the epitaxially grown layer 10 not oxidized is used as the channel section of the vertical MOSFET. However, impurities are diffused from the semiconductor substrate 1 or the p type layer 2 to the epitaxially grown layer 10 during the epitaxially growing step or the later heating step. Therefore, there might be the possibility of difficulty in the control of the impurity concentration of the channel section or the control of the channel length.

In order that all the epitaxially grown layer 10 are oxidized, it is necessary to reduce the thickness of the semiconductor layer 10 to at least ⅔ or less of the thickness of the gate oxide film 5. For example, when a gate oxide film of, for example, 50 nm, is formed, the thickness of the semiconductor layer 10 is set to 30 nm or less. By so doing, all the semiconductor layers 10 can be oxidized.

If the heat treatment is not conducted after the epitaxially growing step like in the first embodiment, the radius of curvature of each of the corners of the groove 4 is determined according to the thickness of the epitaxially grown layer 10 and the taper angle of the faucet surface 12. In general, the larger the thickness of the epitaxially grown layer 10 is, the larger the radius of curvature of each of the corners of the groove 4 becomes. For example, in the case that the taper angle is 45 degrees, the radius of curvature of each of the corners of the groove 4 become about the same as the thickness of the epitaxially grown layer 10. When the taper angle becomes larger than 45 degrees, the radius of curvature of each of the corners of the groove 4 becomes larger than the thickness of the epitaxially grown layer 10.

Normally, since the taper angle of the faucet surface of the selectively epitaxially grown layer 10 is about 60 degrees, the thickness of the epitaxially grown layer 10 is formed thicker than the desired radius of curvature of each of the corners of the groove 4. As a result, the corner of the groove 4 is so rounded as to have the radius of curvature larger than the desired radius of curvature, and hence the withstand voltage can be assured.

In this embodiment as described above, a vertical MOSFET of high performance that the withstand voltage of the gate insulating film is high and the mobility of the carrier of the channel section is large can be realized.

Next, a third embodiment of the present invention will be explained with reference to FIG. 3A and FIG. 3B. In this embodiment, all epitaxially grown layers 10 are not oxidized but retained.

In this third embodiment, up to the formation of an epitaxially grown layer 10, the process is conducted similarly to the first and second embodiments. Thereafter, oxidizing conditions such as an oxidizing temperature and an oxidizing time are suitably so set that, even if the oxidation is conducted, the semiconductor layer 10 remains. A gate insulating film 5 is formed under the conditions. FIG. 3A shows a section of the semiconductor device at this stage. As shown in FIG. 3A, the semiconductor layer 10 remains.

Thereafter, similarly to the first and second embodiments, a gate electrode material 6 is buried in a groove 4, and an n type diffusion layer 4 is so formed in a p type layer 2 as to be disposed adjacent to the groove 4 to complete a vertical MOSFET. FIG. 3B shows a section of the semiconductor device at this stage.

In this third embodiment, since the semiconductor layer 10 remains, the impurity concentration of the channel section of the vertical MOSFET can be suitably set by setting the thickness of the semiconductor layer 10 and the impurity concentration of the semiconductor layer 10.

In the first and second embodiments of the present invention, there is described that, when the semiconductor layer 10 remains, it is difficult to stably control the concentration of the channel section and the channel length of the MOSFET by the diffusion of the impurities from the semiconductor substrate 1 and the p type layer 2. However, this problem can be avoided by controlling the impurity concentrations of the semiconductor substrate 1 and the p type layer 2 and controlling the impurity control of the epitaxially grown layer 10 at the time of epitaxial growth. For example, the impurity concentration of the epitaxially grown layer 10 is set to lower than that of the n type semiconductor substrate 1 and higher than that of the p type layer 2. In this case, the channel length is determined according to the impurity concentration of the n type semiconductor substrate 1, and the concentration of the channel section is determined according to the impurity concentration of the epitaxially grown layer 10 without influence of the diffusion of the p type layer 2.

In the first and second embodiments described above, the concentration of the channel section is determined according to the concentration of the p type layer 2. Since the p type layer 2 is formed at the initial stage of a series of manufacturing steps of the semiconductor device, the impurity concentration of the p type layer 2 is affected by the influence of the step after the p type layer 2 is formed such as, for example, the step of forming the groove 4. When other element is simultaneously formed on the semiconductor substrate formed with the vertical MOSFET, there might be no possibility of freely setting the concentration of the p type layer 2 from the request of the vertical MOSFET. However, when the epitaxially grown layer 10 is used as the channel section of the vertical MOSFET like by this third embodiment, the concentration of the channel section can be freely set without influence of the other steps or element designing. In this manner, the concentration of the channel section of the vertical MOSFET is freely set to more improve the mobility of the carrier and to form the vertical MOSFET of high performance.

In this embodiment as described above, the vertical MOSFET of high performance that the withstand voltage of the gate insulating film is high and the mobility of the carrier of the channel section is large can be realized.

Figure 7:
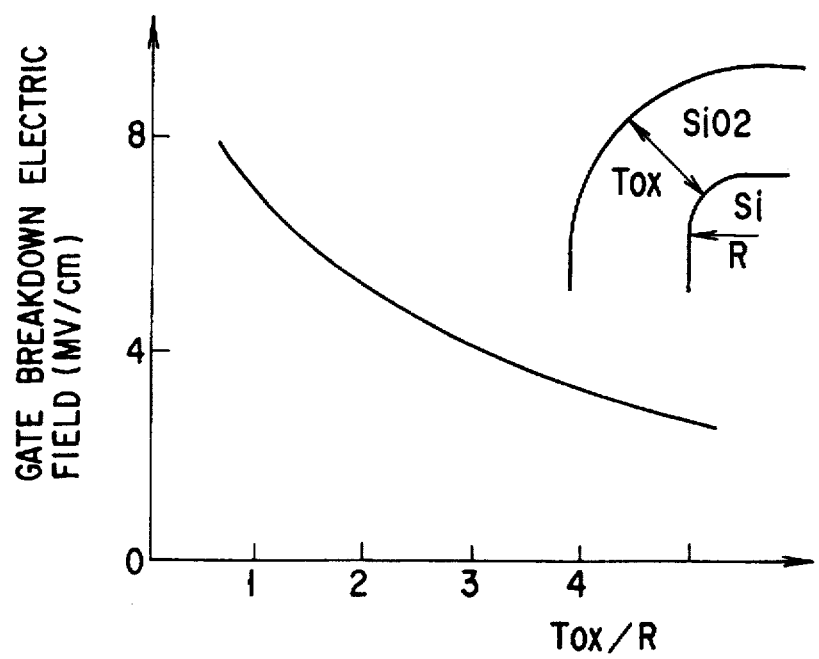
FIG. 7 is a view showing a problem of the conventional semiconductor device.

Incidentally as shown in FIG. 7, the larger the radius of curvature of each of the corners of the groove 4 is, the more the withstand voltage of the gate oxide film is improved. It is general that an electric field for breaking down the gate oxide film formed on the surface of the semiconductor substrate is about 8 MV/cm. Therefore, in order to guarantee the withstand of this degree, it is understood from the graph shown in FIG. 7 that the ratio of the thickness $T_{OX}$ of the gate oxide film to the radius R of curvature of the corner of the groove 4 may be about 1. In the first to third embodiments, the conditions of the thickness of the epitaxially grown layer 10 and the heat treatment after the epitaxial growth are suitably so set that the thickness of the gate insulating film 5 becomes, for example, the same degree as the radius of curvature of the corner of the groove. As a result, the withstand voltage of the gate insulating film of the vertical MOSFET can be set to the same degree as that of the MOSFET of a planar structure.

In the first to third embodiments described above, the gate insulating film 5 is the oxide film formed by the thermal oxidation. The present invention is not limited to the particular embodiments. For example, the gate insulating film 5 may be an oxide film formed by a CVD (Chemical Vapour Deposition) method. The gate insulating film 5 is not limited to the oxide film. For example, the gate insulating film 5 may be an insulating film such as, for example, a nitride film or a high dielectric film, or a laminated film of an oxide film and an insulating film such as its nitride film. Even in this case, even if the nitride film may be formed by, for example, thermal nitriding or a CVD method.

Furthermore, in the first to third embodiment described above, the vertical MOSFET is designated as the example. However, the present invention is not limited to the particular embodiment. For example, the present invention can be applied to all semiconductor devices that have a MOS structure formed with electrodes on the inner wall surface of a groove formed on a semiconductor substrate through an insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor device, comprising the steps of:

forming a groove on a semiconductor substrate by etching;

selectively forming a semiconductor layer on said semiconductor substrate exposed on the inner wall surface of said groove with a mask material layer so formed on the surface of said semiconductor substrate as a mask as to open said groove; removing said mask material layer;

forming an insulating film on the semiconductor layer formed on the inner wall surface of said groove and the surface of said semiconductor substrate; and burying a conductor at least on said insulating film in said groove.

2. The method according to claim 1, wherein a heat treatment is conducted after the step of selectively forming a semiconductor layer on said semiconductor substrate.

3. The method according to claim 2, wherein inert gas at 800° C. or higher is used in said heat treatment.

4. The method according to claim 1, wherein said insulating film is formed by thermally oxidizing the semiconductor layer formed on the inner wall surface of said groove.

5. The method according to claim 4, wherein all the semiconductor layers formed on the inner wall surface of said groove are oxidized by said thermal oxidation.

6. The method according to claim 4, wherein only the surface portion of the semiconductor layer formed on the inner wall surface of said groove is oxidized by said thermal oxidation.

7. The method according to claim 1, wherein said insulating film is formed by depositing an insulating material on the semiconductor layer formed on the inner wall surface of said groove.

8. A method of manufacturing a semiconductor device, comprising the steps of:

forming a groove on a semiconductor substrate, said semiconductor substrate being a first conductivity type, the surface of the semiconductor substrate being provided with a second conductivity type diffusion layer, the groove formed through said diffusion layer by etching;

selectively forming a semiconductor layer on said semiconductor substrate exposed on the inner wall surface of said groove with a mask material layer so formed on the surface of said semiconductor substrate as to open said groove to be used as a mask;

removing said mask material layer;

forming the insulating film on the semiconductor layer formed on the inner wall surface of said groove and the surface of said semiconductor substrate;

burying a conductor at least on said insulating film in said groove; and forming a first conductivity type region in said diffusion layer adjacent to said groove.

9. The method according to claim 8, wherein a heat treatment is conducted after the step of selectively forming a semiconductor layer on said semiconductor substrate.

10. The method according to claim 9, wherein inert gas at 800° C. or higher is used in said heat treatment.

11. The method according to claim 8, wherein said insulating film is formed by thermally oxidizing the semiconductor layer formed on the inner wall surface of said groove.

12. The method according to claim 11, wherein all the semiconductor layers formed on the inner wall surface of said groove are oxidized by said thermal oxidation.

13. The method according to claim 11, wherein only the surface portion of the semiconductor layer formed on the inner wall surface of said groove is oxidized by said thermal oxidation.

14. The method according to claim 8, wherein said insulating film is formed by depositing an insulating material on the semiconductor layer formed on the inner wall surface of said groove.

* * * * *